(12) United States Patent
Ko et al.

(10) Patent No.: US 8,085,059 B2
(45) Date of Patent: Dec. 27, 2011

(54) RF CHIP TEST METHOD

(75) Inventors: Hsuan-Chung Ko, Hsin-Chu (TW); Hsiu-Ju Chen, Hsin-Chu (TW)

(73) Assignee: King Yuan Electronics Co., Ltd., Hsin-Chu (TW)

( * ) Notice: Subject to any disclaimer, the term of this patent is extended or adjusted under 35 U.S.C. 154(b) by 415 days.

(21) Appl. No.: 12/356,481

(22) Filed: Jan. 20, 2009

(65) Prior Publication Data
US 2010/0123475 A1   May 20, 2010

(30) Foreign Application Priority Data
Nov. 19, 2008   (TW) .............................. 97144743 A

(51) Int. Cl.
*G01R 31/00* (2006.01)

(52) U.S. Cl. .............................. 324/756.02; 324/756.04
(58) Field of Classification Search ................ None
See application file for complete search history.

*Primary Examiner* — Roberto Velez
(74) *Attorney, Agent, or Firm* — Stout, Uxa, Buyan & Mullins, LLP

(57) ABSTRACT

An RF chip test method is disclosed. The RF chip test method includes disposing an RF chip within a chip socket, with the RF chip having at least one RF pin and at least one non-RF pin, the chip socket having conductive elements, and the conductive elements contacting the RF pin and the non-RF pin; connecting the non-RF pin to a ground end and connecting the RF pin to an RF measuring instrument; measuring a S11 parameter of the RF pin using the RF measuring instrument; and comparing the S11 parameter with an allowable range so as to judge the contact condition between the RF pin and the conductive element.

13 Claims, 5 Drawing Sheets

| Chip NO.:01 | Chip NO.:02 | Chip NO.:03 | Chip NO.:04 | Chip NO.:05 |
|---|---|---|---|---|
| -8.664 | -8.482 | -8.315 | -8.274 | -8.365 |

| Chip NO.:06 | Chip NO.:07 | Chip NO.:08 | Chip NO.:09 | Chip NO.:10 |
|---|---|---|---|---|
| -8.302 | -8.417 | -8.023 | -8.442 | -8.266 |

| Average | Standard deviation |
|---|---|
| -8.355 | 0.167 |

FIG. 8A

| Chip NO.:01 | Chip NO.:02 | Chip NO.:03 | Chip NO.:04 | Chip NO.:05 |
|---|---|---|---|---|
| 0.281 | -0.878 | 0.185 | 1.074 | 1.098 |

| Chip NO.:06 | Chip NO.:07 | Chip NO.:08 | Chip NO.:09 | Chip NO.:10 |
|---|---|---|---|---|
| -0.616 | -5.747 | -6.829 | 0.890 | 0.960 |

FIG. 8B

RF CHIP TEST METHOD

BACKGROUND OF THE INVENTION

1. Field of the Invention

The present invention generally relates to a chip test method, and more particularly to an RF chip test method.

2. Description of the Prior Art

Chip tests are typically performed during semiconductor chip production processes to ensure the quality of electrical characteristics of the semiconductor chips being fabricated. FIG. 1 is a schematic diagram corresponding to a prior-art chip test process. A chip 50 is disposed within a chip socket 110. The chip 50 has at least one non-RF pin 51 and at least one RF pin 52. The chip socket 110 is disposed on a test board 120. The test board 120 has at least one test circuit. The chip socket 110 has a plurality of conductive elements 130. The press mechanism 70 moves downward to make the conductive elements 130 contact the non-RF pin 51 and the RF 52 pin tightly.

Generally, when performing the chip test process of the chip 50, a DC open/short test will be performed first to ensure the contact condition between the non-RF pin 51 and the conductive elements 130. The electric resistance of the non-RF pin 51 is measured by a DC source so as to ensure the properties of ESD protecting diode of the chip 50. When performing the DC open/short test, the direct current is provided by a digital power source (DPS) or a precise measure unit (PMU), and the electric resistance is calculated using the measured voltage.

The chip test process of the RF pin 52 is a high frequency analog test. When the RF pin 52 and the chip socket 110 has a bad contact condition, high frequency parasitic capacitance and parasitic inductance will be formed between the RF pin 52 and the chip socket 110. Moreover, the chip test result of the RF pin 52 will be affected by the high frequency parasitic capacitance and parasitic inductance. Therefore, the contact condition between the RF pin 52 and the chip socket 110 should be ensured before the high frequency analog test of the RF pin 52.

In the conventional chip test machine, the RF pin 52 is connected to an RF measuring instrument. The RF pin 52 is not connected to a DC source (DPS/PMU) that is able to perform the DC open/short test. In order to perform the DC open/short test of the RF pin 52, RF relays must be disposed on the test board 120 for switching the RF pin 52 to the DC source (DPS/PMU) or the RF measuring instrument. When performing the DC open/short test, the RF pin 52 is connected to the DC source (DPS/PMU). When performing the high frequency analog test, the RF pin 52 is connected to the RF measuring instrument.

However, there are some disadvantages associated with the RF relays. The RF relays have to use the space of the test board 120, the cost of the RF relay is high, the working life of the RF relay is short, and it is necessary to change RF relays frequently in mass production contexts. Therefore, the cost of the RF chip test is increased.

As a consequence of RF relays increasing the high frequency parasitic capacitance and parasitic inductance of the test circuit of the test board 120, chip test results are adversely affected by high frequency parasitic capacitance and parasitic inductance. Therefore, the test result of the RF chip is not stable.

Besides, in order to make the chip test result stable, the total chip test time is increased because it is necessary to add delay time after switching the test circuits by the RF relays. Therefore, the efficiency of the RF chip test process is low.

For reasons including the disadvantages of the prior art mentioned above, there is a need to propose a novel RF chip test method. Use of such an RF chip test method should vitiate the need to use RF relays to test the contact condition between RF pins and the chip socket.

SUMMARY OF THE INVENTION

Accordingly, the present invention has been made in order to meet needs including that described above, and it is an object of the present invention to provide an RF chip test method responsive to this need. By using the RF chip test method, use of RF relays for testing the contact condition between RF pins and the chip socket can be eliminated.

In order to achieve the above objects, the present invention provides an RF chip test method. The RF chip test method includes disposing an RF chip within a chip socket, wherein the RF chip has at least one RF pin and at least one non-RF pin, the chip socket has a plurality of conductive elements, and the conductive elements contact the RF pin and the non-RF pin; connecting the non-RF pin to a ground end and connecting the RF pin to an RF measuring instrument; measuring a S11 parameter of the RF pin using the RF measuring instrument; and comparing the S11 parameter with an allowable range so as to judge the contact condition between the RF pin and the conductive element.

The RF chip test method of the present invention is capable of testing the contact condition between RF pins and the chip socket without RF relays. The test result of the RF chip is stable, and the efficiency of the test process is also increased.

BRIEF DESCRIPTION OF THE DRAWINGS

FIG. 8A shows the S11 parameters of a specific frequency 4.2 GHz of RF pins of different chips, wherein the RF pins and the conductive elements have a good contact condition; and FIG. 8B shows the S11 parameters of the specific frequency 4.2 GHz of RF pins of different chips, wherein the RF pins and the conductive elements have a bad contact condition.

DETAILED DESCRIPTION OF THE INVENTION

The detailed description of the present invention will be discussed in the following embodiments, which are not intended to limit the scope of the present invention and which can be adapted for other applications. While the drawings are illustrated in detail, it is appreciated that the quantity of the disclosed components may be greater or less than that disclosed with the exception of contexts expressly restricting the amount of the components.

Figure 2:
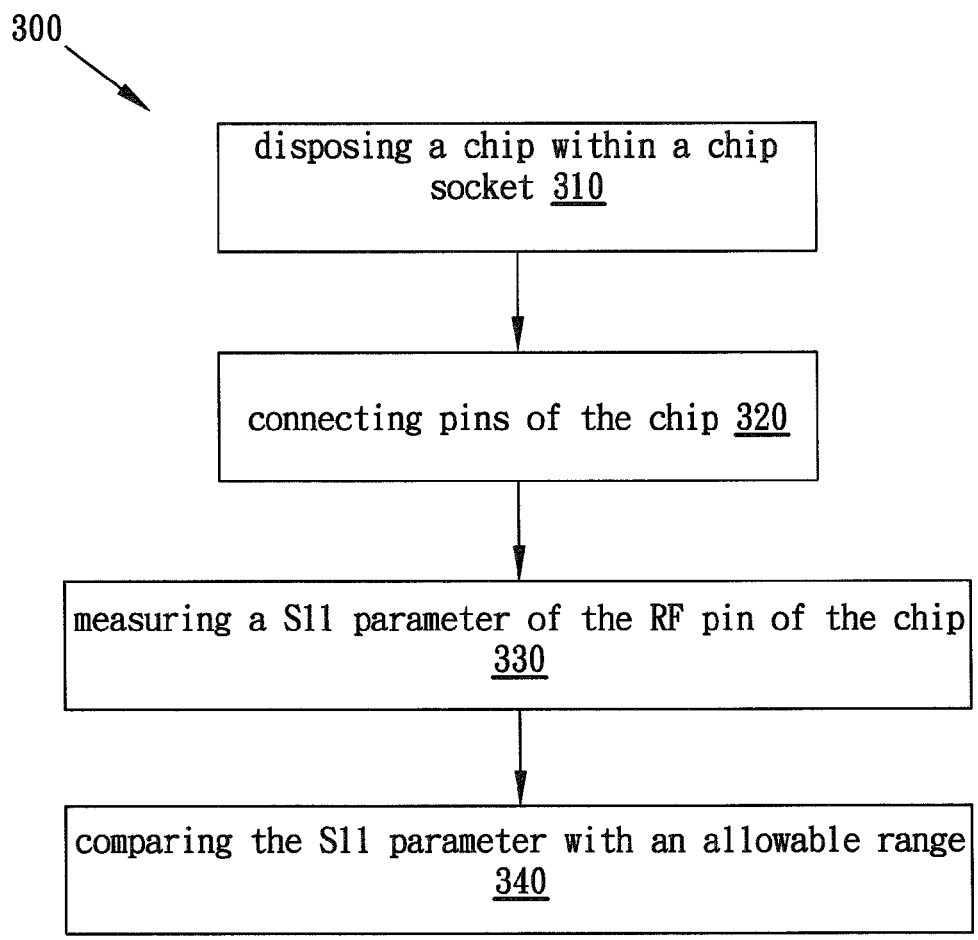
FIG. 2 shows a flow diagram of an RF chip test method in accordance with a preferred embodiment of the present invention.

FIG. 2 shows a flow diagram of an RF chip test method 300 in accordance with a preferred embodiment of the present invention. The RF chip test method 300 includes the following steps.

Figure 1:
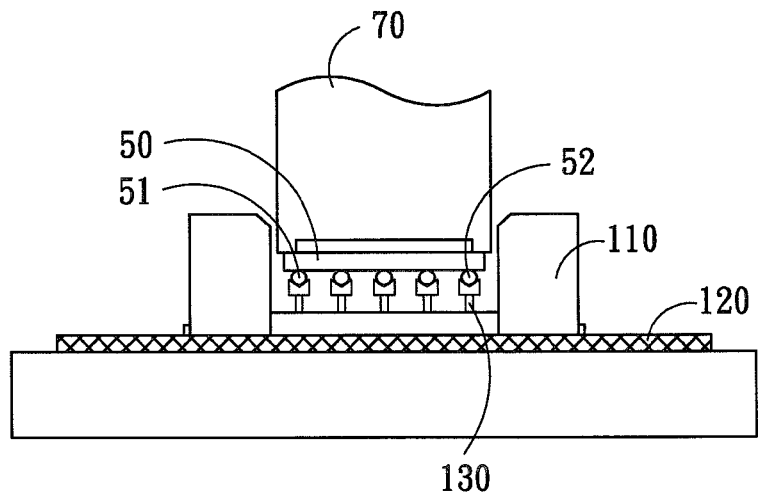
FIG. 1 is a schematic diagram of a chip test process according to the prior art.

First, with reference to FIG. 1, the performance of step 310 comprises disposing a chip 50 within a chip socket 110. The chip 50 has at least one non-RF pin 51 and at least one RF pin 52. The chip socket 110 is disposed on a test board 120. The test board 120 has at least one test circuit. The chip socket 110 has a plurality of conductive elements 130. The conductive elements 130 contact the non-RF pin 51 and the RF 52 pin respectively.

Figure 3:
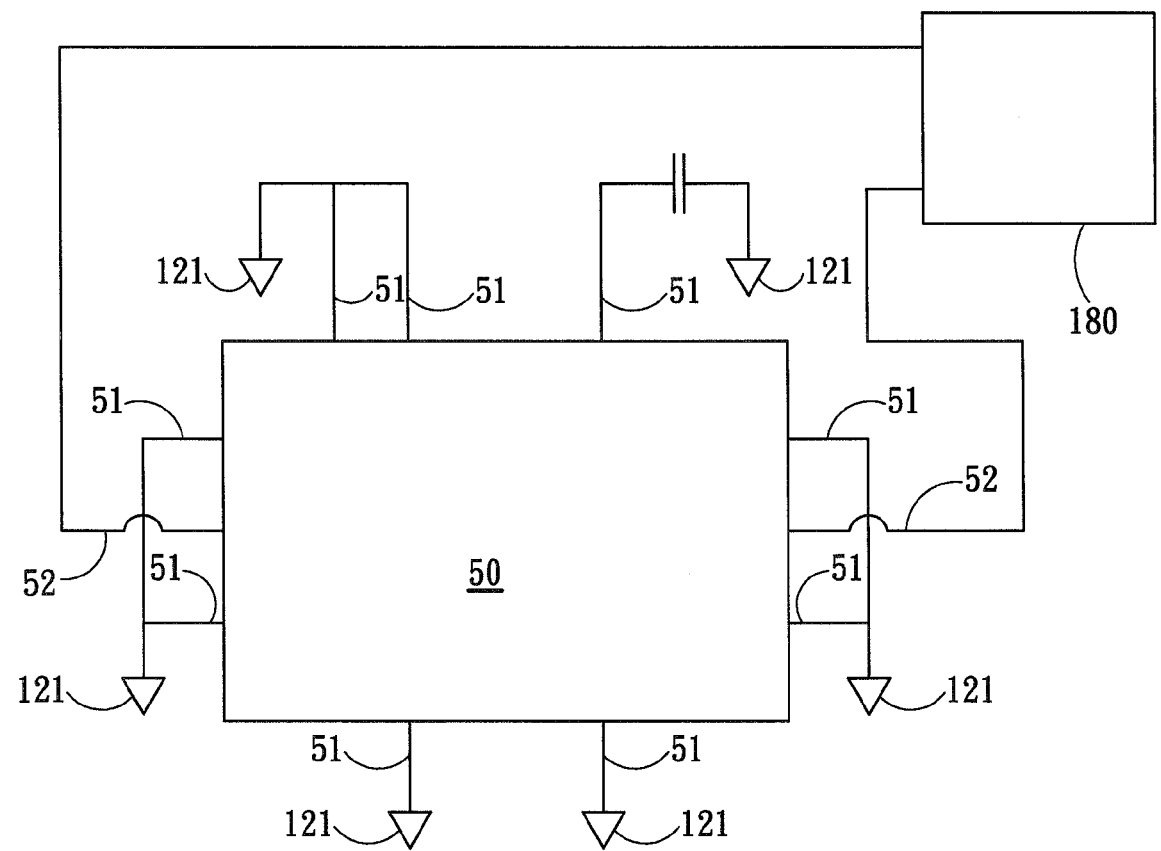
FIG. 3 shows an electrical diagram corresponding to the RF chip test method.

FIG. 3 shows an electrical diagram corresponding to the RF chip test method. Performing step 320 comprises connecting the non-RF pin 51 to a ground end 121 and connecting the RF pin 52 to an RF measuring instrument 180. In this embodiment, the RF measuring instrument 180 is a Vector Network Analyzer. The Vector Network Analyzer is a measuring device used for analyzing the frequency-domain response. The Vector Network Analyzer is capable of presenting information (the properties) using a scattering-parameter paradigm.

With continued reference to FIG. 2, performance of step 330 comprises a S11 parameter (return loss) of a specific frequency of the RF pin 52 being measured using the RF measuring instrument 180. Because the operating voltage of each chip 50 may be different, connecting the non-RF pin 51 to a ground end 121 is suitable for each chip 50. There will be no risk that the chip 50 may be damaged. The S11 parameter measured is the physical properties of the transistor in the off stage condition.

Figure 4:
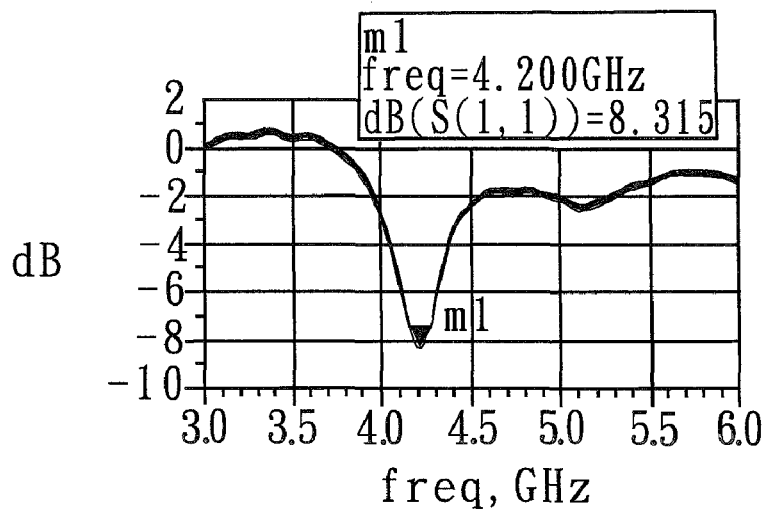
FIG. 4 shows the S11 parameters of the same RF pin of the same RF chip, with the RF pin and the conductive element having a good contact condition.

FIG. 4 shows the S11 parameters of the same RF pin 52 of the same RF chip 50, with the RF pin 52 and the conductive element 130 having a good contact condition.

The S11 parameters can be measured using the following steps: disposing a chip 50 within a chip socket 110; connecting the non-RF pin 51 of the chip 50 to a ground end and connecting the RF pin 52 to a Vector Network Analyzer; measuring a S11 parameter (return loss) of the RF pin 52, wherein the upper limit of the frequency range for measuring the S11 parameter can be the working frequency of the chip 50 and the lower limit of the frequency range for measuring the S11 parameter can be 1 GHz below the working frequency of the chip 50; removing the chip 50; and repeating the steps mentioned above.

When the RF pin 52 and the conductive element 130 have a good contact condition, the S11 parameters concentrate on one value. In this embodiment, the S11 parameters of the same RF pin 52 have the minimum value at the frequency 4.2 GHz. Therefore, 4.2 GHz is the specific frequency of the RF pin 52.

Figure 5:
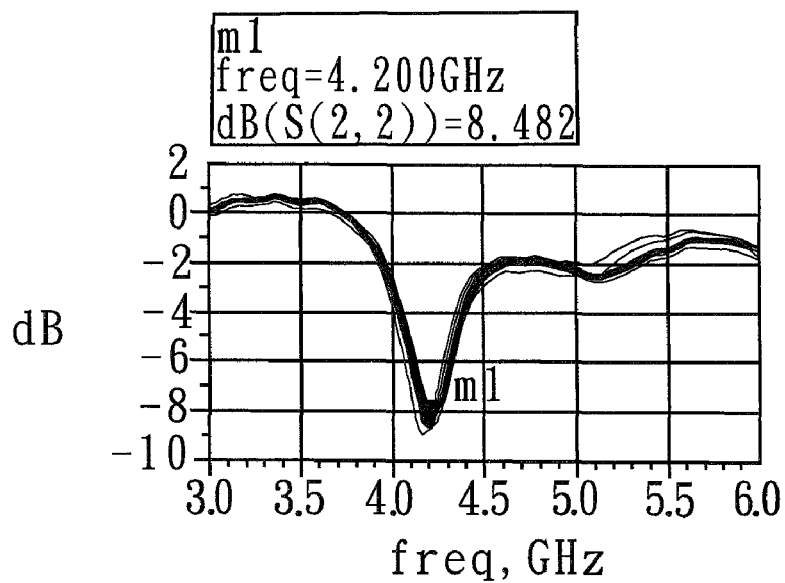
FIG. 5 shows the S11 parameters of the same RF pins 52 of different chips, with the RF pins and the conductive elements having a good contact condition.

FIG. 5 shows the S11 parameters of the same RF pins 52 of different chips 50, with the RF pins and the conductive elements having a good contact condition.

When the RF pins 52 of the different chips 50 and the conductive element 130 have a good contact condition, the S11 parameters also concentrate on one value. In this embodiment, the S11 parameters of the RF pins 52 have the minimum value at the frequency 4.2 GHz. Therefore, 4.2 GHz is the specific frequency of the RF pin 52 of the chips 50.

Figure 6:
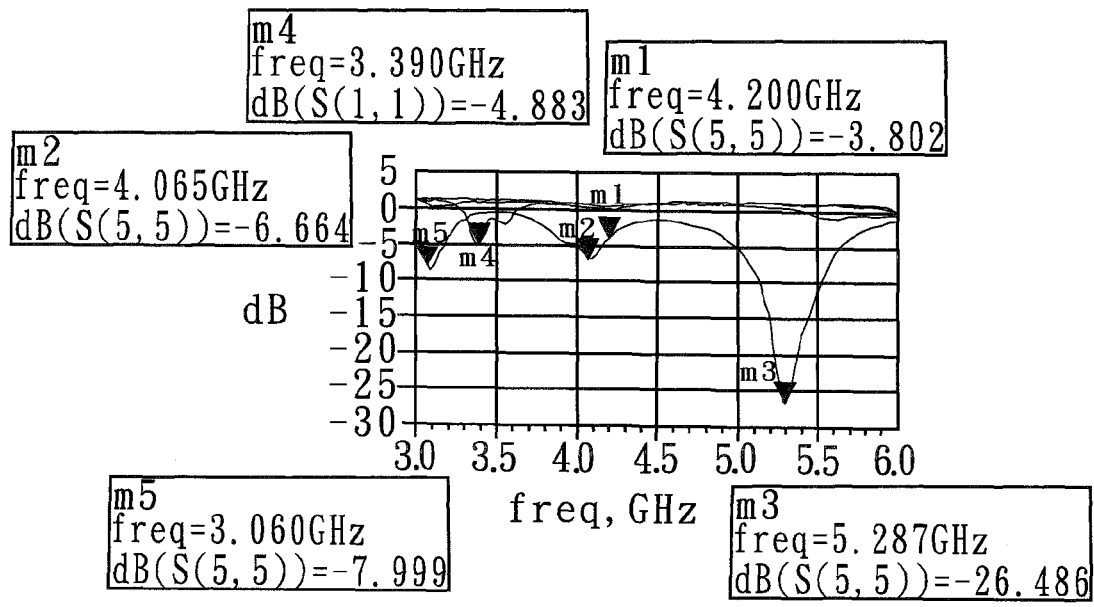
FIG. 6 shows the S11 parameters of the same RF pin of the same chip, with the RF pin and the conductive element having a bad contact condition.

FIG. 6 shows the S11 parameters of the same RF pin 52 of the same chip 50, with the RF pin 52 and the conductive element 130 having a bad contact condition. The S11 parameters have been measured five times. When the RF pin 52 and the conductive element 130 have a bad contact condition, the S11 parameters of the same chip 50 do not concentrate on one value, and the S11 parameters of frequency 4.2 GHz are larger than the S11 parameters of the good contact condition.

Figure 7:
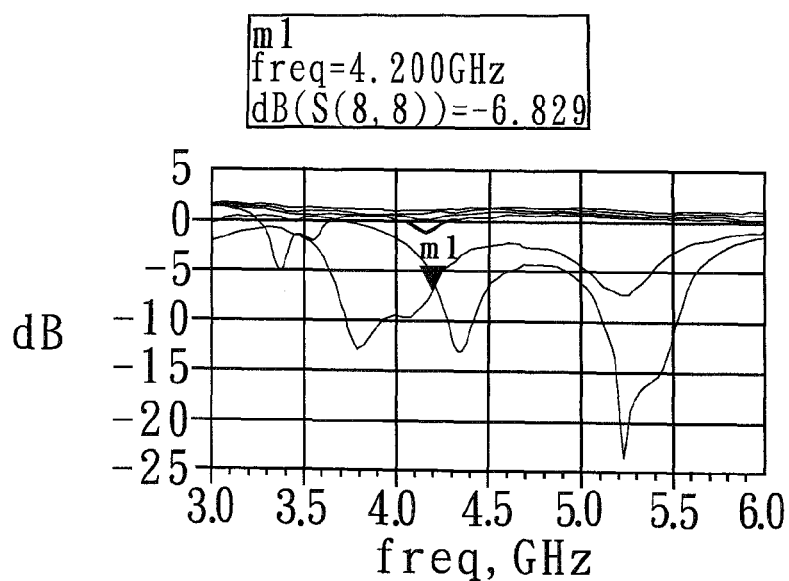
FIG. 7 shows the S11 parameters of the same RF pins 52 of the different chips, with the RF pins and the conductive elements having a bad contact condition.

FIG. 7 shows the S11 parameters of the same RF pins 52 of the different chips 50, with the RF pins 52 and the conductive elements 130 having a bad contact condition. The S11 parameters have been measured ten times. When the RF pins 52 and the conductive elements 130 have a bad contact condition, the S11 parameters of different chip 50 do not concentrate on one value, and the S11 parameters of frequency 4.2 GHz are larger than the S11 parameters of the good contact condition.

FIG. 8A shows the S11 parameters of the specific frequency 4.2 GHz of RF pins 52 of different RF chips 50, wherein the RF pins 52 and the conductive elements 130 have a good contact condition. When the RF pins 52 and the conductive elements 130 have a good contact condition, the S11 parameters concentrate on one value. The average value of the S11 parameters is −8.355, and the standard deviation value is 0.167.

When the S11 parameters are distributed in normal distribution, the average value plus/minus 3 times of the standard deviation value can cover 99.75% range of the S11 parameters. In this embodiment, the allowable range has an upper limit which is the average value plus three times of the standard deviation value. The upper limit is −7.853 in this case. Moreover, the allowable range does not have a lower limit because a smaller S11 parameter indicates that the return loss is smaller.

Finally, performing step 340, the S11 parameter is compared with an allowable range so as to judge the contact condition between the RF pin 52 and the conductive element 130.

FIG. 8B shows the S11 parameters of the specific frequency 4.2 GHz of RF pins 52 of different RF chips 50, wherein the RF pins 52 and the conductive elements 130 have a bad contact condition. When the RF pins 52 and the conductive elements 130 have a bad contact condition, the S11 parameters do not concentrate on one value and the S11 parameters are not within the allowable range. Therefore, it is possible to judge the contact condition between the RF pin 52 and the conductive element 130 by comparing the S11 parameter with the allowable range mentioned above.

For example, when the S11 parameter is within the allowable range, the RF pins 52 and the conductive element 130 have a good contact condition. When the S11 parameter is not within the allowable range, the RF pins 52 and the conductive element 130 have a bad contact condition.

By using the RF chip test method of the present invention, testing of the contact condition between RF pins and the chip socket without RF relays becomes possible. The test result of the RF chip is stable, and the efficiency of the test process is also increased.

Although specific embodiments have been illustrated and described, it will be appreciated by those skilled in the art that various modifications may be made without departing from the scope of the present invention, which is intended to be limited solely by the appended claims.

What is claimed is:
1. An RF chip test method, comprising:
disposing an RF chip within a chip socket, wherein said RF chip has at least one RF pin and at least one non-RF pin, the chip socket has a plurality of conductive elements, and said conductive elements contact said RF pin and said non-RF pin;

connecting said non-RF pin to a ground end and connecting said RF pin to an RF measuring instrument;

measuring a S11 parameter (return loss) of a specific frequency of said RF pin using said RF measuring instrument; and comparing said S11 parameter with an allowable range so as to judge the contact condition between said RF pin and said conductive element.

2. The RF chip test method according to claim 1, wherein said measuring device is a Vector Network Analyzer.

3. The RF chip test method according to claim 1, wherein when said RF pin and said conductive element have a good contact condition, the frequency of the minimum value of said S11 parameter is said specific frequency.

4. The RF chip test method according to claim 1, wherein when said RF pin and said conductive element have a good contact condition, said allowable range is determined by an average value and a standard deviation value of a plurality of said S11 parameters of said RF chip.

5. The RF chip test method according to claim 1, wherein said allowable range has an upper limit and said upper limit is said average value plus three times of said standard deviation value.

6. An RF chip test method, comprising:

measuring a S11 parameter (return loss) of a specific frequency of an RF pin of an RF chip, wherein said RF pin and a chip socket have a good contact condition and the frequency of a minimum value of said S11 parameter is said specific frequency;

measuring an allowable range of said RF pin of a plurality of RF chips, wherein said RF pin and said chip socket have a good contact condition, said allowable range is determined by an average value and a standard deviation value of S11 parameters of said RF chip;

disposing another RF chip within said chip socket, wherein said another RF chip has at least one RF pin and at least one non-RF pin;

connecting said non-RF pin to a ground end and connecting said RF pin to an RF measuring instrument;

measuring a S11 parameter (return loss) of said specific frequency of said RF pin by said RF measuring instrument; and comparing said S11 parameter with said allowable range so as to judge the contact condition between said RF pin and said chip socket.

7. The RF chip test method according to claim 6, wherein said RF measuring instrument is a Vector Network Analyzer.

8. The RF chip test method according to claim 6, wherein said allowable range has an upper limit and said upper limit is said average value plus three times of said standard deviation value.

9. An RF chip test method, comprising:

measuring a specific frequency of an RF pin of an RF chip;

measuring an allowable range of said RF pin of a plurality of RF chips;

disposing another RF chip within said chip socket, wherein said another RF chip has at least one RF pin and at least one non-RF pin;

connecting said non-RF pin to a ground end and connecting said RF pin to an RF measuring instrument;

measuring a S11 parameter (return loss) of said specific frequency of said RF pin using said RF measuring instrument; and comparing said S11 parameter with said allowable range so as to judge a contact condition between said RF pin and said chip socket.

10. The RF chip test method according to claim 9, wherein said RF measuring instrument is a Vector Network Analyzer.

11. The RF chip test method according to claim 9, wherein when said RF pin and said chip socket have a good contact condition, the frequency of the minimum value of said S11 parameter is said specific frequency.

12. The RF chip test method according to claim 9, wherein when said RF pin and said chip socket have a good contact condition, said allowable range is determined by an average value and a standard deviation value of a plurality of said S11 parameters of said RF chip.

13. The RF chip test method according to claim 12, wherein said allowable range has an upper limit and said upper limit is said average value plus three times of said standard deviation value.

* * * * *